United States Patent
Lu et al.

(10) Patent No.: US 10,614,386 B2
(45) Date of Patent: Apr. 7, 2020

(54) PCB BOARD ASSEMBLING METHOD AND ASSEMBLING SYSTEM

(71) Applicants: GUANGZHOU FASTPRINT CIRCUIT TECH CO., LTD., Guangzhou (CN); SHENZHEN FASTPRINT CIRCUIT TECH CO., LTD., Shenzhen (CN); GUANGZHOU FASTPRINT ELECTRONIC CO., LTD., Guangzhou (CN)

(72) Inventors: Xianwen Lu, Guangzhou (CN); Dejin Zhang, Guangzhou (CN); Lijun Yi, Guangzhou (CN); Xi Chen, Guangzhou (CN)

(73) Assignees: Guangzhou Fastprint Circuit Tech Co., Ltd., Guangzhou (CN); Shenzhen Fastprint Circuit Tech Co., Ltd., Shenzhen (CN)

( * ) Notice: Subject to any disclaimer, the term of this patent is extended or adjusted under 35 U.S.C. 154(b) by 52 days.

(21) Appl. No.: 16/066,373

(22) PCT Filed: Aug. 26, 2016

(86) PCT No.: PCT/CN2016/096915
§ 371 (c)(1),
(2) Date: Jun. 27, 2018

(87) PCT Pub. No.: WO2017/113838
PCT Pub. Date: Jul. 6, 2017

(65) Prior Publication Data
US 2019/0019115 A1  Jan. 17, 2019

(30) Foreign Application Priority Data
Dec. 30, 2015 (CN) .......................... 2015 1 1029403

(51) Int. Cl.
*G06Q 10/04* (2012.01)
*H05K 3/36* (2006.01)
(Continued)

(52) U.S. Cl.
CPC ............. *G06Q 10/04* (2013.01); *G06F 30/39* (2020.01); *H05K 3/0097* (2013.01); *H05K 3/36* (2013.01);
(Continued)

(58) Field of Classification Search
CPC ....... G06Q 10/04; G06F 17/5068; H05K 3/36
(Continued)

(56) References Cited

U.S. PATENT DOCUMENTS 6,678,878 B2 * 1/2004 Smith et al. ........ G06F 17/5068
716/122
8,607,169 B2 * 12/2013 Leu .................. G05B 19/41875
716/100
(Continued)

FOREIGN PATENT DOCUMENTS

CN 1560779 A 1/2005
CN 102036493 4/2011
(Continued)

OTHER PUBLICATIONS

Search Report for Chinese Patent Application No. 201511029403.X dated Jul. 19, 2019, 3 pages.
(Continued)

*Primary Examiner* — Sun J Lin
(74) *Attorney, Agent, or Firm* — Seyfarth Shaw LLP

(57) ABSTRACT

A printed circuit board (PCB) panelization method and a PCB panelization system are disclosed herein. The PCB panelization method comprises the following steps: S1, reading daughterboard information of purchase orders,
(Continued)

wherein the daughterboard information comprises respective areas, delivery quantities and attributes of daughterboards; S2, performing comparison of the daughterboard information, screening for daughterboards having attributes that are the same, and establishing a panelization rule database; S3, selecting panels (PNLs) satisfying requirements according to panelization requirements; S4, selecting, from the daughterboards having the same attributes as the selected panels, daughterboards to be panelized together for the selected panels, and arranging a graphical layout for a panelization of the selected panels. The system comprises: a reading module-used for reading the daughterboard information of the purchase orders; the panelization rule database for storing the information of the screened daughterboards having the same attributes; a panel selecting module used for selecting the panel satisfying the requirements according to the panelization requirements; and a panelization engine calculation module used for selecting the daughterboards in order from large to small, determining whether the daughterboards can be panelized together, determining whether the arrangement of the layout for the panelization is successful, determining the daughterboards to be panelized together finally, and arranging the layout for the panelization.

10 Claims, 3 Drawing Sheets

(51) Int. Cl.
G06F 17/50 (2006.01)
H05K 3/00 (2006.01)
G06F 30/39 (2020.01)
(52) U.S. Cl.
CPC ... H05K 3/0005 (2013.01); H05K 2203/0195 (2013.01); H05K 2203/166 (2013.01); Y02P 90/30 (2015.11)

(58) Field of Classification Search
USPC .................................................. 716/119, 137
See application file for complete search history.

(56) References Cited

U.S. PATENT DOCUMENTS

2005/0086616 A1* 4/2005 Wang et al. ............ G06F 17/50
716/122
2013/0024400 A1* 1/2013 DeCusatis et al. .........................
G06F 17/5068
705/400
2015/0301525 A1* 10/2015 Hirschman et al. .........................
G05B 19/41865
700/107

FOREIGN PATENT DOCUMENTS

| CN | 102821557 | 12/2012 |
| CN | 102833961 A | 12/2012 |
| CN | 103747614 | 4/2014 |
| CN | 203691754 | 7/2014 |
| CN | 104797092 | 7/2015 |
| CN | 105678408 | 6/2016 |

OTHER PUBLICATIONS

Rao Fu-Wei, et al., "A New Algorithm for the PCB Nesting Problem," Manufacturing Automation, May 5, 2015, pp. 26-28, vol. 37-05, China.
Third Office Action for Chinese Patent Application No. 201511029403.X dated Jul. 19, 2019, 8 pages.
PCT Search Report for Application No. PCT/CN2016/096915, dated Nov. 29, 2016, 3 pages.

* cited by examiner

PCB BOARD ASSEMBLING METHOD AND ASSEMBLING SYSTEM

CROSS REFERENCE TO RELATED APPLICATIONS

This is a National Stage application of PCT/CN2016/096915, filed Aug. 26, 2016, which claims priority to Chinese Patent Application No. 201511029403.X, filed Dec. 30, 2015, the disclosures of which are incorporated herein by reference in their entirety.

TECHNICAL FIELD

The disclosure relates to the technical field of Printed Circuit Board (PCB) manufacturing, and in particular to a PCB panelization method and system.

BACKGROUND

At present, when a PCB manufacturing factory manufactures PCB of different purchase orders, the sub-boards of different purchase orders may be produced in one panel (PNL) by panelization, because the sub-board structures are similar or the same and the respective final delivery quantity is not enough for one production batch. Currently, an existing panelization method is mainly to manually screen out a range of purchase orders that meet the requirements of panelization, and manually arrange the layout of the files. This panelization method has many defects, such as low efficiency of the panelization, excessive manual intervention, not flowing of part of the production data in the production system, the over-dependence on staff experience in the panelization work, high manual error rate, not suitable for promotion.

SUMMARY

Based on this, the present disclosure aims to overcome the shortcomings of the prior art and provides a Printed Circuit Board (PCB) panelization method and a panelization system, which can increase the number of types of on-line produced sub-boards, reduce on-line production batches, and improve production efficiency.

The technical scheme is as follows.

A PCB panelization method, including the following steps:

S1: reading information of sub-boards of each purchase order, wherein the information of sub-board includes an area, a delivery quantity, and an attribute of each sub-board, the attribute at least including a number of layers of the sub-board, a board thickness, and board material;

S2: comparing the information of sub-board of the sub-boards, screening for sub-boards having the same attribute, and establishing a panelization rule base;

S3: selecting a panel (PNL) that meets a requirement for panelization;

S4: selecting, from the sub-boards having the same attribute as the selected panel, sub-boards to be panelized together according to each type of the panels selected, and arranging a layout for panelization.

The technical scheme also provides a PCB panelization system, including:

a reading module, configured to read information of sub-boards of each purchase order;

a panelization rule base, configured to store information of screened sub-boards with having the same attribute;

a panel selection module, configured to select a panel that meets a requirement for panelization;

a panelization engine calculation module, configured to select sub-boards according to a descending order of sizes of the sub-boards, determine whether the sub-boards can be panelized together and whether arrangement of layout is successful, determine the sub-boards that will be finally panelized together, and perform the arrangement of layout.

Beneficial Effects of the Present Disclosure

The disclosure provides a PCB panelization system, which automatically panelizes the sub-boards having the same attribute in purchase orders to manufacture, increasing the number of types of on-line produced sub-boards and reducing on-line production batches. The system of the disclosure can establish a panelization rule base and realize automatic screening without the need of manual screening of purchase orders. Arrangement of graphical layout can be performed automatically by the panelization algorithm, which can reduce the dependence on the staff experience, and the operation is simple and easy to control, improving the efficiency of the project production and manufacture.

During the sub-board selection process, it is ensured that all sub-boards are selected and determined. The sub-boards are selected according to the descending order of the delivery areas. In this way, the maximized degree of the sub-board panelization on a PNL can be achieved, and the sub-boards having large areas and being difficult to be panelized are prioritized to panelize. On the basis of this, the sub-boards having small areas and being easy to be panelized are then panelized, which realizes the panelization combination with large areas matching small areas, easiness matching difficulty, and solves the problem of the manual panelization that sub-boards with larger areas are penalized first, leaving many different types of sub-boards which cannot be panelized in a later stage. At the same time, constraint conditions such utilization rate for panelization are set to ensure the optimization of the combination and the utilization rate of the layout. For the combination or solution that does not meet the constraint conditions, it continues to circulate according to the sub-board selection method and the determination method. The present disclosure is an optimal panelization scheme obtained under the constraint conditions of panelization utilization rate and maximizing the number of panelized sub-boards.

DETAILED DESCRIPTION OF THE EMBODIMENT

The following describes in detail embodiments of the present disclosure.

Figure 1:
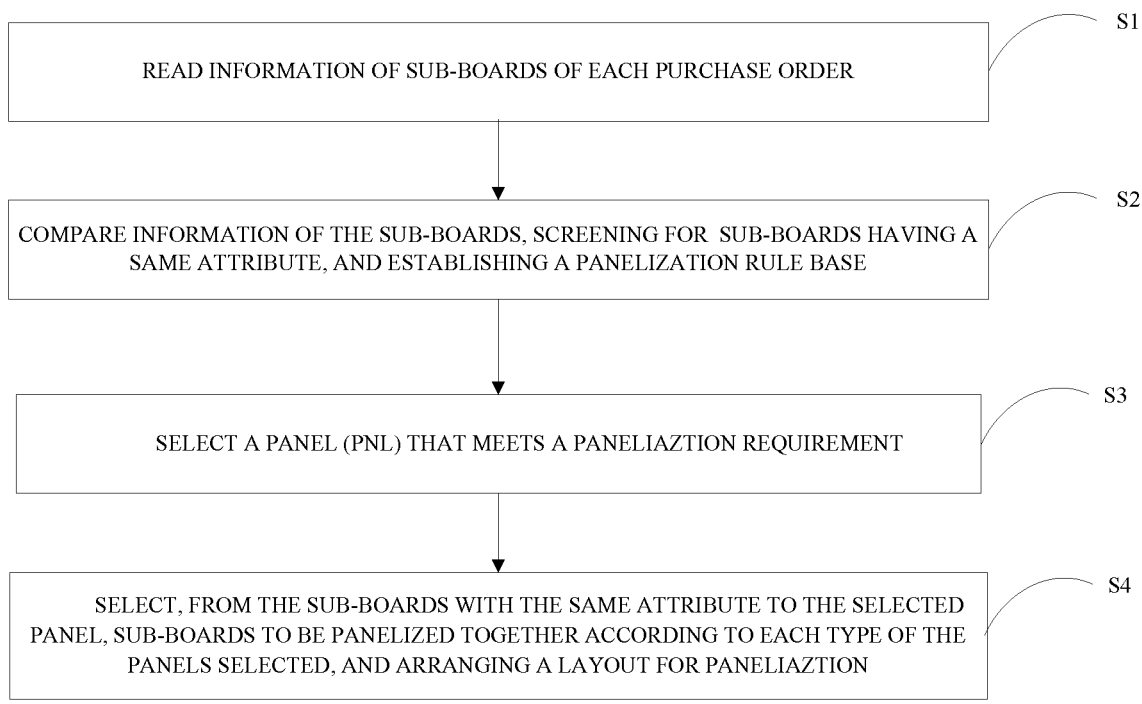
FIG. 1 is a schematic flowchart diagram illustrating a PCB panelization method according to one embodiment.

As shown in FIG. 1, a PCB panelization method includes the following steps.

S1: reading information of sub-boards of each purchase order, the information of sub-board including an area, a delivery quantity, and an attribute of each sub-board, the attribute at least including an order delivery time, an order type, a number of layers of the sub-board, a board thickness, board material, surface technology, thickness of an inner layer of copper foil, thickness of an outer layer of copper foil, color of solder resist and character color, etc.

S2: comparing the information of sub-board of the sub-boards, screening for sub-boards having the same attribute, and establishing a panelization rule base.

S3: selecting a panel (PNL) that meets a panelization requirement.

S4: selecting, from the sub-boards having the same attribute to the selected panel, sub-boards to be panelized together according to each type of the panels selected, and arranging a layout for panelization.

According to the scheme of the embodiment of the present disclosure as described above, the sub-boards having the same attribute in the purchase orders are automatically panelizes to manufacture, increasing the number of types of on-line produced sub-boards and reducing on-line production batches. The scheme of the disclosure can establish a panelization rule base and realize automatic screening without the need of manual screening of purchase orders. Arrangement of graphical layout can be performed automatically by the panelization algorithm, which can reduce the dependence on the staff experience, and the operation is simple and easy to control, improving the efficiency of the project production and manufacture.

Figure 2:
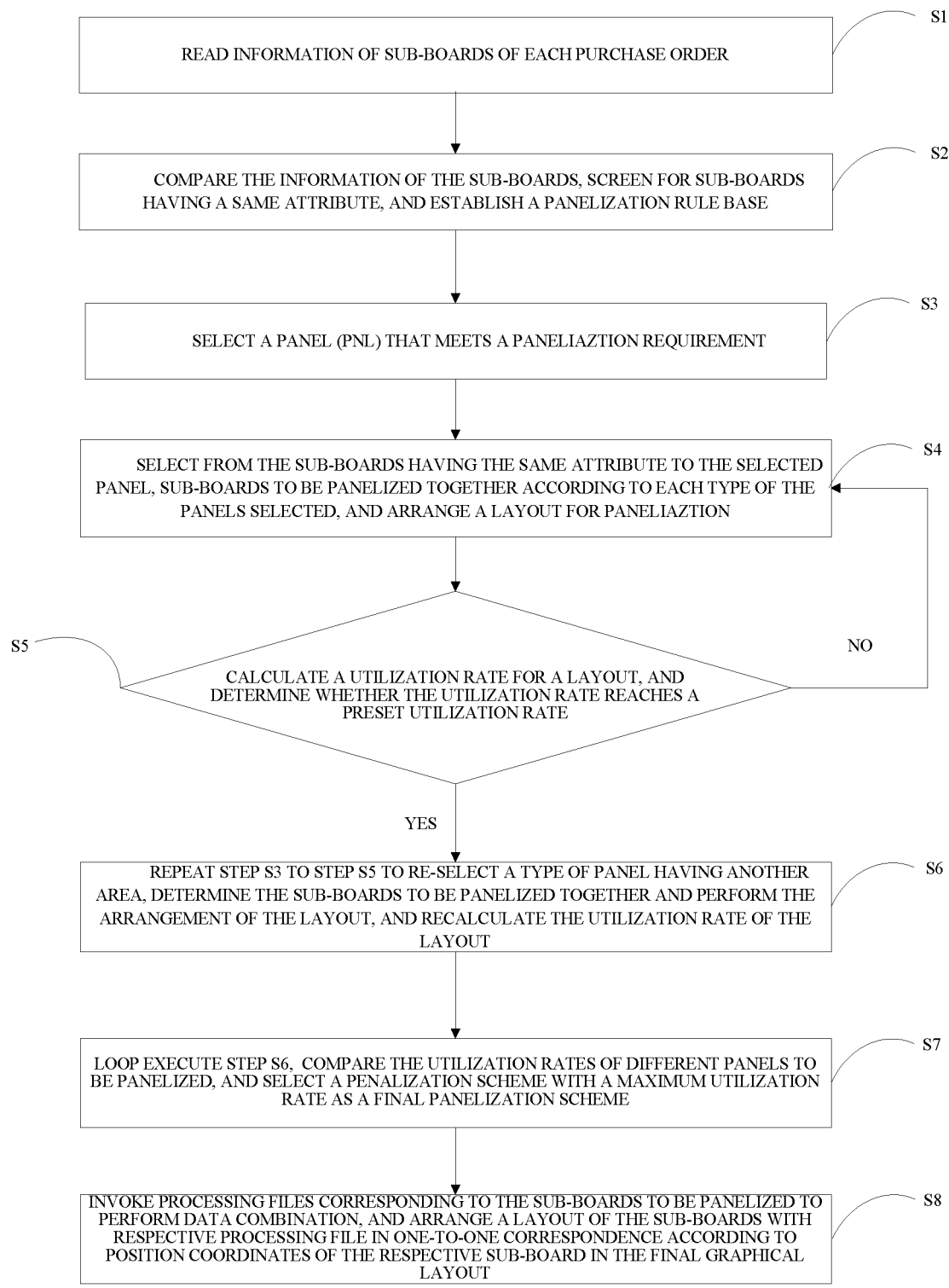
FIG. 2 is a schematic flowchart diagram illustrating a PCB panelization method according to another embodiment.

Specifically, as shown in FIG. 2, step S4 includes the following steps.

S41: listing the sub-boards having the same attribute to the selected panel as sub-boards $A_1$, $A_2$, $A_3$ . . . $A_n$ in descending order of their area sizes;

S42: selecting sub-board $A_1$ as a first sub-board to be panelized, and determining whether sub-boards $A_1$ and $A_2$ can be panelized together; if they can be panelized, perform step (a); and if they cannot be panelized, perform step (b);

Step (a): arranging a graphical layout for panelization of sub-boards $A_1$ and $A_2$, and determining whether arrangement of the layout for panelization is successful; if it is successful, perform step ($a_1$), if it fails, perform step ($a_2$);

Step ($a_1$): continuing by adding sub-board $A_3$, determining whether sub-boards $A_1$, $A_2$, and $A_3$ can be panelized and whether arrangement of layout is successful in a way similar to that for sub-boards $A_1$ and $A_2$, and so on; if they can be panelized and the arrangement of layout is successful, then adding a next sub-board to perform determining;

Step($a_2$): polling solutions of different orders of arrangement of layout to determine whether a solution that meets the layout conditions can be found within a preset search time; if the solution that meets the layout conditions can be found within the preset search time, perform the step ($a_1$), and if the solution that meets the typesetting conditions cannot be found within the preset search time, perform the step (b).

Step (b): discarding the sub-board $A_2$, adding the sub-board $A_3$, and determining whether sub-boards $A_1$ and $A_3$ can be panelized and whether the arrangement of layout is successful according to the method similar to that for determining sub-boards $A_1$ and $A_2$, and so on; if they cannot be panelized or the arrangement of layout fails, then discarding the sub-board just added, and adding a next sub-board to be determined.

S43: storing sub-boards that cannot be panelized in the panelization rule base, reordering and re-panelizing them according to the above-mentioned panelization method.

By the present disclosure, during the sub-board selection process, it is ensured that all sub-boards are selected and determined. The sub-boards are selected according to the descending order of the delivery areas. In this way, the maximized degree of the sub-board panelization on a PNL can be achieved, and the sub-boards having large areas and being difficult to be panelized are prioritized to panelize. On the basis of this, the sub-boards having small areas and being easy to be panelized are then panelized, which realizes the panelization combination with large areas matching small areas, easiness matching difficulty, and solves the problem of the manual panelization that sub-boards with larger areas are penalized first, leaving many different types of sub-boards which cannot be panelized in a later stage. By determining whether the sub-boards can be panelized by the loop search, the present disclosure can perform searching and arranging of the layout at same time, so as to ensure not only the extensiveness of the search, but also the feasibility of the search results.

In this embodiment, determining whether sub-boards $A_1$, $A_2$ can be panelized in step S42 specifically includes the following steps.

S421: calculating a number of required panels based on a ratio of a sum of a total area (delivery area) of sub-board $A_1$ and a total area (delivery area) of sub-board $A_2$ to an area of the selected panels;

S422: calculating a number of sub-boards $A_1$ and $A_2$ on each panel based on a ratio of a delivered quantity of sub-boards $A_1$ and $A_2$ to the required number of panels;

S423: verifying whether the sum of the total area of sub-board $A_1$ and the total area of sub-board $A_2$ on each panel exceeds the area of the selected panel; if it does not exceed, perform step (c); if it exceeds, perform step (d);

Step (c): outputting an instruction indicating that the panelization can be performed;

Step (d): increasing the number of required panels by one, repeating steps S422-S423, until step (c) is performed; when the number of required panels increases to a preset maximum number of panels, if it is still not possible to perform step (c), outputting an instruction indicating that the panelization cannot be performed.

In the following, a specific example will be used to help explain the panelization determination method between the sub-boards in the present disclosure, as shown in Table 1 below.

TABLE 1

| Type of Sub-boards | Area ($m^2$) | Delivery Quantity (Piece) | Delivery Area of Sub-board ($m^2$) | Total Delivery Area ($m^2$) | Area of Panel ($m^2$) |
|---|---|---|---|---|---|
| $A_1$ | 0.02 | 20 | 0.4 | 0.4 + 0.4 + 0.7 + 0.72 = 2.22 | 0.28 (18 × 24 inch) |
| $A_2$ | 0.01 | 40 | 0.4 | | |
| $A_3$ | 0.02 | 35 | 0.7 | | |
| $A_4$ | 0.03 | 24 | 0.72 | | |

The specific calculation is as follows. The total delivery area of sub-boards $A_1$, $A_2$, $A_3$ and $A_4$÷area of PNL=2.22÷0.28=7.93, which takes an integer 8, meaning that at least 8 pieces of PNLs are needed. On each PNL, the number of sub-boards $A_1$ is 20÷8=2.5, which takes 3; the number of sub-boards $A_2$ is 40÷8=5; the number of sub-boards $A_3$ is 35÷8=4.375, which takes 5; and the number of sub-boards $A_4$ is 24÷8=3. After determining the number of the respective sub-boards, the total area of the respective sub-boards on each PNL can be verified as 0.02×3+0.01× 5+0.02×5+0.03×3=0.30 $m^2$>0.28 $m^2$ (area of PNL). Thus, the sub-boards $A_1$ $A_2$, $A_3$, and $A_4$ cannot be panelized. $A_4$ is discarded, and A5 is added. According to the above method, it is determined whether $A_1$, $A_2$, $A_3$, and $A_5$ can be panelized.

In practical calculations, generally, it is also necessary to take into account the area occupied by the width of the PNL edge (for example, 0.8 inch) and the spacing (for example, 0.1 inch) between the sub-boards, which is estimated as about 0.02 m², and the area that the sub-board can actually be placed is about 0.28−0.02=0.26 m². For example: the PNL size is 18×24 inch, with a minimum board edge width as 0.4 inch, then the area occupied by the edge will be (0.4*2*(18+24)−0.4*0.4*4)/1550=0.021 m²≈0.02 m². The data given in the above example is only for illustrating the determination method between the sub-boards, and it should not be understood as a limitation of the present disclosure.

In this embodiment, the arrangement of the graphical layout of the sub-boards $A_1$ and $A_2$ described in step (a) specifically includes the following steps.

Setting the spacing between the sub-boards according to the critical polygon algorithm to ensure that the sub-boards do not overlap or cross with each other in the layout;

locating the respective sub-board graphic according to the left-to-bottom optimization algorithm to improve the utilization rate of the layout.

When the above method for arranging the layout fails to arrange the sub-boards after the panelization determination on a PNL, the arranging fails. The order for arranging the layout is adjusted and the arranging is re-set (using a smart search algorithm to search the order for arranging the layout), and the successful arrangement can be marked on the PNL as long as just one reasonable arrangement of the layout is obtained. If a solution meeting the arranging condition can be found within the preset search time or within the preset search condition, the sub-board added later is discarded, and the next sub-board is added for determination.

FIG. 2 shows a schematic flow chart diagram of a PCB panelization method in another embodiment. As shown in FIG. 2, after the step S4, the method further includes the following steps:

S5: calculating a utilization rate for a layout, and determining whether the utilization rate reaches a preset utilization rate; if the utilization rate reaches the preset utilization rate, perform step (e) (not shown in the Figure), and if the utilization rate does not reach the preset utilization rate, perform steps (f);

(e) outputting information corresponding to a final layout of the selected PNL;

(f) Returning to step S4, specifically, discarding the last sub-board to be panelized. Until finding a solution that has a utilization rate greater than the preset utilization rate, outputting the information corresponding to the final typesetting of the selected PNL.

The present disclosure sets the constraint conditions such as panelization efficiency to ensure the optimization of the combination and the utilization rate of the panelization. For the combination or solution that does not meet the constraint conditions, it continues to circulate according to the sub-board selection method and the determination method. Those skilled in the art can understand that the present disclosure can also adopt various other parameter conditions, such as a minimum number of types of sub-boards in each PNL, to ensure the optimization of the panelization.

In this embodiment, the PNL that meet the requirements are a plurality of PNL with different area sizes. After the step (e), the following steps are also included;

S6: repeating step S3 to step S5 to re-select panel having another area, determining the sub-boards to be panelized together and performing the typesetting, and recalculating the utilization rate of the typesetting.

S7: loop executing step S6, comparing the utilization rates of different PNLs to be panelized, and selecting a panelization scheme with a maximum utilization rate as a final panelization scheme. The present disclosure can also set the above test conditions (utilization rate) to other constraints such as the optimal number of PNLs and the minimization of the panelization time according to actual needs. The purpose is to obtain different types of layout schemes and select the optimal scheme according to the constraints by changing the specifications of the PNL. The present disclosure obtains an optimal solution under the constraint conditions such as the integration rate, the utilization rate, the optimal number of PNL, and the minimization of the panelization time, etc.

After determining the final layout scheme, the following steps will be performed.

S8: invoking processing files (CAM files) corresponding to the sub-boards to be panelized to perform data combination, and arranging a layout of the sub-boards with respective processing file in one-to-one correspondence according to position coordinates of the respective sub-board in the final graphical layout.

Figure 3:
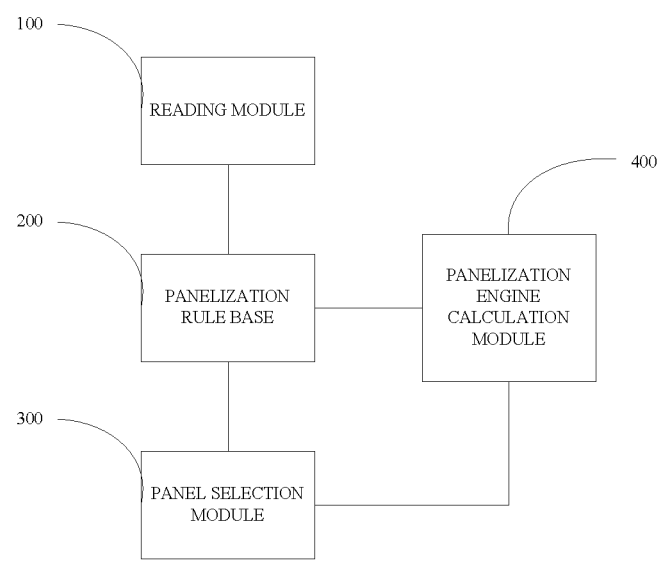
FIG. 3 is a schematic structural diagram illustrating a PCB panelization system according to an embodiment of the present disclosure.

As shown in FIG. 3, a PCB panelization system using the aforementioned panelization method. The system includes:

a reading module 100, configured to read information of sub-boards in each purchase order;

a panelization rule base 200, configured to store information of screened sub-boards with having the same attribute;

a panel (PNL) selection module 300, configured to select a panel that meets a panelization requirement; and a panelization engine calculation module 400, configured to select sub-boards according to a descending order of sizes of the sub-boards, determine whether the sub-boards can be panelized together and whether the arrangement of layout is successful, determine the sub-boards that will be finally panelized together, and perform arrangement of layout.

In this embodiment, the panelization engine calculation module 400 includes:

a sub-board selection algorithm module, configured to select the sub-boards according to a descending order of sizes of the sub-boards, determine whether the selected sub-boards can be panelized by a panelization determination module, determine whether the arrangement of layout is successful by a layout module, loop traversing all sub-boards that have the same attribute and determine the sub-boards to be panelized together;

a panelization determination module, configured to determine whether the selected sub-boards can be panelized together according to a determination that whether the total area of sub-boards $A_1$ and $A_2$ on each PNL exceeds the area of the selected PNL board, and if it cannot be panelized, returning to the sub-board selection algorithm module and reselecting the sub-boards to be panelized, if it can be panelized together, then the arrangement of layout is performed by a layout module; and a layout module, configured to set the spacing between the sub-boards according to the critical polygon algorithm; locate the respective sub-board graphic according to the left-to-bottom optimization algorithm; and determining whether the arrangement of layout is successful.

The present disclosure further includes a data processing module which is configured to invoke the processing files corresponding to the respective sub-board to be panelized to perform data combination, the processing file and the sub-boards in one-to-one correspondence in the layout according to the position coordinates of the respective sub-board calculated by the panelization engine calculation module 400. After the processing data is combined, the production data is outputted and the panelized board flow indication data is generated. Also, the data required for the feed is stored in the database.

In summary, the present disclosure establishes a management system including information of sub-board identification, panelization order layout arrangement, feeding and panelization file data combination etc., in a unified circulation. By the development of the panelization engine calculation module 400, an optimal automatic graphic layout scheme is determined according to the delivery quantity of each sub-board. The panelization process and data combination are fully automated to improve the efficiency of project production. By the panelized order flow indication data, the performance in the production system is unified to improve the efficiency of factory management. The specific implementation effect is as follows (20,000 types of purchase orders per month are counted).

Comparison of time-consuming: it takes about 30 minutes for manual panelization of each purchase order, while about 15 minutes by using the panelization system. The efficiency of the project panelization is doubled. The engineering time is shortened, the production time is extended, and the rate of delivery is increased.

Comparison of offline rate of the varieties: 70% for the manual panelization, and 57.3% using the panelization system, with a drop of 13%.

Comparison of sub-board panelization rate: 3% for the manual panelization, and 3.2% on average using the panelization system, increasing by 0.2%.

Quality improvement: the quality hidden dangers due to manual filling can be eliminated and the quality qualification rate is improved.

The technical features of the above embodiments may be combined arbitrarily. For the purpose of the brief description, all the possible combinations of the technical features in the above embodiments are not described. However, as long as there is no contradiction in the combination of these technical features, it is thought that it is the range described in this specification.

The above embodiments merely illustrate several embodiments of the present disclosure, and the description thereof is more specific and detailed, but it should not be construed as limiting the scope of the disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

The invention claimed is:

1. A Printed Circuit Board (PCB) panelization method, comprising the steps of:
    S1: respectively reading information of sub-boards in a purchase order, wherein the information of each of the sub-boards includes an area, a delivery quantity, and an attribute of the sub-board, and wherein the attribute includes a number of layers, a board thickness, and a board material, of the sub-board;
    S2: respectively comparing the information of the sub-boards, screening for sub-boards having a same attribute, and establishing a panelization rule base;
    S3: selecting a panel (PNL) that meets a panelization requirement; and
    S4: selecting, from the sub-boards having the same attribute to the selected panel, sub-boards to be panelized together according to a type of the selected panels, and arranging a layout for panelization.

2. The method according to claim 1, wherein the step of S4 comprises:
    S41: listing the sub-boards having the same attribute to the selected panel as sub-boards $A_1, A_2, A_3 \ldots A_n$ in descending order of their respective areas;
    S42: selecting sub-board $A_1$ as a first sub-board to be panelized, and determining whether sub-boards $A_1$ and $A_2$ can be panelized together; wherein if sub-boards $A_1$ and $A_2$ can be panelized together, perform step S42(a); wherein if sub-boards $A_1$ and $A_2$ cannot be panelized together, perform step S42(b);
    step S42(a): arranging a graphical layout for panelization of sub-boards $A_1$ and $A_2$, and determining whether arrangement of the graphical layout of sub-boards $A_1$ and $A_2$ for panelization is successful; wherein if the graphical layout of sub-boards $A_1$ and $A_2$ for panelization is successful, perform step S42($a_1$);
    step S42($a_1$), continuing by adding sub-board $A_3$, determining whether the sub-boards $A_1, A_2$ and $A_3$ can be panelized together and whether arrangement of a graphical layout for panelization of the sub-boards $A_1$, $A_2$, and $A_3$ is successful in a way similar to that for the sub-boards $A_1$ and $A_2$; if sub-boards $A_1, A_2$, and $A_3$ can be panelized together and arrangement of the graphical layout is successful, then adding a next sub-board to perform determining;
    step S42(b), discarding the sub-board $A_2$, adding sub-board $A_3$, and determining whether the sub-boards $A_1$ and $A_3$ can be panelized and whether arrangement of a graphical layout for panelization of sub-boards $A_1$ and $A_3$ is successful in a way similar to that for the sub-boards $A_1$ and $A_2$, and so on, if they cannot be panelized or arrangement of the graphical layout fails, then discarding the sub-board $A_3$, and adding a next sub-board to perform the step of determining whether panelization of sub-board $A_1$ and the next sub-board is successful;
    S43: storing sub-boards that cannot be panelized in the panelization rule base, and repeating step S4.

3. The method according to claim 2, wherein the step of determining whether sub-boards $A_1$ and $A_2$ can be panelized together in step S42 comprises:
    S421: calculating a number of required panels based on a ratio of a sum of a total area of sub-board $A_1$ and a total area of sub-board $A_2$ to an area of the selected panel;
    S422: calculating a number of sub-boards $A_1$ and $A_2$ on each panel based on a ratio of a delivered quantity of sub-boards $A_1$ and $A_2$ to a number of required panels; and
    S423: verifying whether the sum of the total area of sub-board $A_1$ and the total area of sub-board $A_2$ on each panel exceeds the area of the selected panel; wherein if the total area of sub-board $A_1$ and the total area of sub-board $A_2$ on each panel does not exceed the area of the selected panel, perform step S423(c); wherein if the total area of sub-board $A_1$ and the total area of sub-board $A_2$ on each panel does exceed the area of the selected panel, perform step S423(d);
    step S423(c): outputting an instruction indicating that the panelization can be performed;
    step S423(d): increasing the number of required panels by one, repeating steps S422 to S423, until step S423(c) is performed; when the number of required panels increases to a preset maximum number of panels, if it is still not possible to perform step S423(c), outputting an instruction indicating that the panelization cannot be performed.

4. The method according to claim 2, wherein the step of arranging a graphical layout for panelization of sub-boards $A_1$ and $A_2$ in step S42(a) comprises:

setting a spacing between the sub-boards $A_1$ and $A_2$ according to a critical polygon algorithm; and locating a respective sub-board graphic according to a left-to-bottom optimization algorithm.

5. The method according to claim 2, wherein step S42(a) further comprises:

if arrangement of the graphical layout fails, perform step S42($a_2$), step S42($a_2$): polling solutions of different layout orders to determine whether a solution that meets layout conditions can be found within a preset search time; if the solution that meets typesetting conditions can be found within the preset search time, perform the step S42($a_1$), and if the solution that meets the typesetting conditions cannot be found within the preset search time, perform the step S42(b).

6. The method according to claim 2, further comprising the steps after step S4:

S5: calculating a utilization rate for a layout, and determining whether the utilization rate reaches a preset utilization rate; wherein if the utilization rate reaches the preset utilization rate, perform step S5(e), and wherein if the utilization rate does not reach the preset utilization rate, perform step S5(f);

step S5(e) outputting information corresponding to a final graphical layout of the selected panel of the sub-boards;

step S5(f) returning to step S4.

7. The method according to claim 6, wherein step S5(f) comprises:

discarding a last sub-board to be panelized.

8. The method according to claim 6, wherein the selected panel that meets the panelization requirement comprises a plurality of panels with respectively different area sizes, and the method further comprises the steps after step S5(e):

S6: repeating step S3 to step S5 to re-select a type of panel having another area, determining the sub-boards to be panelized together and performing arrangement of the layout, and recalculating the utilization rate of the layout; and S7: loop executing step S6, comparing the utilization rates of different sub-boards to be panelized, and selecting a panelization scheme with a maximum utilization rate as a final panelization scheme.

9. The method according to claim 8, further comprising the following step after step S7:

S8: invoking processing files corresponding to the sub-boards to be panelized to perform data combination, and arranging a layout of the sub-boards with respective processing files in one-to-one correspondence according to position coordinates of the respective sub-board in the final graphical layout.

10. A PCB panelization system using the PCB panelization method of claim 1, comprising:

a reading module, configured to read information of sub-boards in a purchase order; a panelization rule base, configured to store information of screened sub-boards having a same attribute;

a panel (PNL) selection module, configured to select a panel that meets a panelization requirement;

a panelization engine calculation module, configured to select sub-boards according to a descending order of sizes of the sub-boards, determine whether the sub-boards can be panelized together and whether arrangement of layout is successful, determine the sub-boards that will be finally panelized together, and perform arrangement of layout.

* * * * *